Aug. 4, 1959 L. P. HUNTER 2,898,247

FABRICATION OF DIFFUSED JUNCTION SEMI-CONDUCTOR DEVICES

Filed Oct. 24, 1955

*INVENTOR.*

LLOYD P. HUNTER

*BY* Alvin J. Riddles

AGENT

United States Patent Office 2,898,247

Patented Aug. 4, 1959

2,898,247

FABRICATION OF DIFFUSED JUNCTION SEMI-CONDUCTOR DEVICES

Lloyd P. Hunter, Poughkeepsie, N.Y., assignor to International Business Machines Corporation, New York, N.Y., a corporation of New York Application October 24, 1955, Serial No. 542,131

9 Claims. (Cl. 148—1.5)

This invention relates to the fabrication of junction semiconductor devices and more particularly to methods of forming such devices using the technique of vapor diffusion.

The formation of a junction in a semiconductor body involves the introduction of conductivity determining impurities of one type in greater concentration than conductivity determining impurities of another type into a region of the body. This may be accomplished by the technique of vapor diffusion wherein the semiconductor body is heated in an atmosphere comprising the vapor of the desired impurity material. Under these conditions the impurity diffuses into the semiconductor body and when the concentration of a particular impurity predominates in a region of the body the conductivity of that region is determined by the impurity.

The term junction as used in this application includes both the region of demarcation formed in a body of semiconductor material between contiguous zones of opposite type conductivity and the region of demarcation formed in a body of semiconductor material between contiguous zones of one type of conductivity and intrinsic semiconductor material. It may be pointed out here that although a semiconductor material may exhibit intrinsic conductivity at a given temperature it always exhibits an extrinsic conductivity characteristic of P or N type when measurements are made of a sufficiently low temperature.

The depth of penetration of an impurity into a semiconductor body by the vapor diffusion process has been determined to be much greater where the surface of the semiconductor body is covered by a coating of a material with which the impurity may combine and, in accordance with the invention, this principle is employed for the fabrication of semiconductor devices.

The improved process lends itself to the formation of plural junctions of any size or shape in a single semiconductor body with the penetration of the impurity taking place uniformly under the coated area so that junctions are provided in a plane parallel to the surface of the body. The process also permits very close control over inter-junction distances in a semiconductor crystal because of the uniform rate of diffusion.

Accordingly, a primary object of this invention is to provide an improved vapor diffusion method of making semiconductor devices.

Another object is to provide a method of introducing conductivity determining impurities into a semiconductor body to more than one depth of penetration in a single operation.

Still another object is to provide an improved method of forming semiconductor devices having a multiplicity of junctions in a single semiconductor body.

A related object is to provide a vapor diffusion method of making semiconductor devices wherein all surface material of the semiconductor body exposed during the diffusion process is removed.

Other objects of the invention will be pointed out in the following description and claims and illustrated in the accompanying drawings, which disclose, by way of example, the principle of the invention and the best mode, which has been contemplated of applying that principle.

Figure 1:
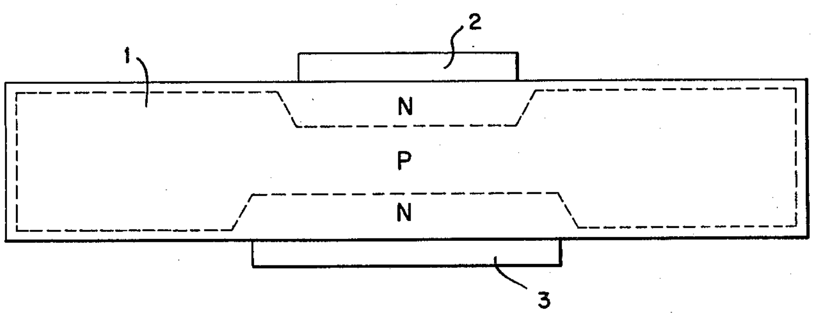
Figure 1 shows a semiconductor body having areas coated with a vapor combining material in accordance with the invention and into which impurities have been diffused.

An NPN transistor has been selected for illustrating a semiconductor device having a multiplicity of junctions in a semiconductor body. Obviously other semiconductor devices including other types of transistors might be used for the purpose and the invention is not to be considered limited to any particular type. The size, shape and degree of parallelism of the junctions as well as the inter-junction distances have a marked influence on the performance of such devices. From a description of the process of this invention as applied in fabricating this particular transistor, its application to other junction semiconductor structures such as unipolar transistors may readily be practiced by one skilled in the art.

In fabricating an NPN transistor a body of P type conductivity semiconductive material is selected, for example a germanium crystal containing a controlled quantity of P type impurity. Such a P type impurity material usually comprises one of the elements of group III of the periodic table of which indium and gallium are members. The body is generally of wafer shape with the thickness dimension closely controlled for reasons well known in the art.

A layer of, for example, indium is applied to each side of the body, coating an area approximately equal to the area of the desired junctions which are to be the emitter and collector of the transistor. The layers of indium may be of any desired thickness and may be applied by methods known in the art as for example by the technique of vacuum evaporation through a mask to provide a controlled area deposit.

The semiconductor body having the indium coated areas is next subjected to heat in the presence of a vapor comprising an N type impurity material which may be an element of group V of the periodic table, for example, arsenic. The germanium crystal body may be maintained at a sufficiently high temperature to permit diffusion while exposed to the arsenic vapor and, due to the presence of the indium, the arsenic diffuses into the semiconductor body to an appreciably greater depth under the indium coated area than it does on the uncoated surfaces. The manner in which this takes place has not definitely been established but it is believed that the group III element coating on the surface of the semiconductor combines with the group V element vapor chemically as in formation of an intermetallic III–V group compound and that an excess of the diffused element is present as a solution of the diffused element in the compound. It is considered that the presence of this compound serves to retain the diffusion impurity in contact with the surface more intimately and in greater concentration and to thereby accelerate the rate of diffusion into the semiconductor. This type of reaction takes place with a coating material of one impurity type and a diffusion impurity material of the other type. It has been established that a coating of an impurity material on the surface of the semiconductor body that is capable of reacting chemically or physically with the material being diffused so as to retain the latter material in contact with the surface will result in deeper penetration of the diffused element. A small molten zone of an alloy of the impurity being diffused and the semiconductor body material will also serve to hold the impurity in contact with the surface of the body and accelerate the diffusion. The formation of such a molten zone is difficult to accomplish because it requires a close approach to the equilibrium vapor pressure of the impurity. The effect of the approach to the equilibrium vapor pressure will be described later.

Referring now to Figure 1 an NPN transistor is shown in an intermediate stage of manufacture after completion of diffusion of the impurity material as described above in accordance with this invention. The body 1 is of P type conductivity semiconductor material such as germanium containing a controlled quantity of indium impurity to provide this type of conductivity. On opposite surfaces of the body 1 are coated areas 2 and 3 of a P type impurity such as indium. The device has been subjected to heat in the presence of a vapor containing an N type impurity such as arsenic and the arsenic has diffused into the surface of the body 1 to a predetermined depth, shown as a dotted line, and converted the penetrated areas to N type material. The depth of penetratoin of the arsenic is appreciably greater under the coatings 2 and 3.

A portion of the surface areas of the body 1 may now be removed to a uniform depth sufficient to expose the P type conductivity material in those areas where lesser penetration is obtained. This may be performed in any conventional manner as for example by chemical etching, electrolytic etching or abrading. Connections may then be soldered or otherwise affixed to the exposed zones to provide the transistor structure shown in Figure 2.

Figure 2:
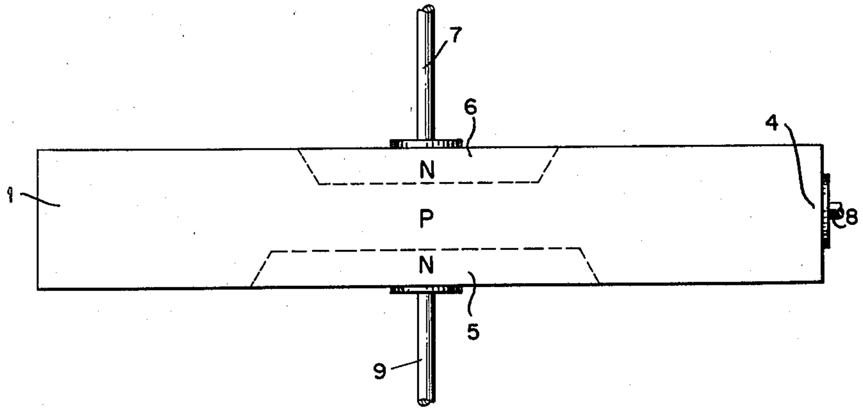
Figure 2 shows a completed NPN transistor made by removal of portions of the surfaces of the body illustrated in Figure 1.

The NPN transistor shown in Figure 2 is in a final stage of manufacture with the exposed region of P type conductivity 4 serving as the base of the transistor and the N regions 5 and 6 serving as emitter and collector respectively. Connections 7, 8 and 9 are shown soldered to the emitter, base and collector respectively. As may be seen from the different sizes of the emitter region 4 and the collector region 5 it is possible to produce zones of opposite conductivity type having any shape in a semiconductor body by the novel process merely by varying the shape of the coating or coatings 2 and 3 that are applied to the surface.

The technology of vapor diffusing impurities into a semiconductor body is quite involved and precise control of both the ingredients and the environment are essential to produce junctions to a definite depth of penetration. The following comments are provided to point out the major places where close control is essential. In diffusing an impurity into a semiconductor body it is necessary to impart sufficient energy to the atoms of the impurity through heat to cause appreciable penetration. In order to diffuse to a significant depth in a reasonable length of time the temperature required is generally much greater than the alloy temperature of the impurity-semiconductor combination. If the impurity element is capable of forming an alloy with the semiconductor at a temperature lower than the diffusion temperature, care must be used to keep the concentration of the impurity in the vapor below the equilibrium vapor pressure of the impurity. Failure to do this will permit the formation of an alloy with a resulting melting of the semiconductor body. For good control of the size of the region to be converted the diffusion temperature must be kept below the melting temperature of the compound. This insures retaining the compound in the selected area.

The depth of penetration of the impurity is determined by the diffusion constant, the surface conditions of the semiconductor body, the concentration of the impurity in the vapor and the time of exposure. The diffusion constant will change with the type of impurity and the temperature. The surface condition is a measure of the imperfections present in the surface of the body that will permit the impurity to enter the body directly and begin the diffusion process from a point below the surface.

This results in a greater total depth of penetration in a given time. The depth of penetration is directly influenced by the concentration of the impurity in the vapor and by the duration of the exposure, in other words with longer times of exposure or with greater concentrations of impurity in the vapor, the penetration depth will increase. From the above it will be apparent that a specific depth of penetration is predictable by one skilled in the art from the factors of semiconductor body material, impurity material, concentration of impurity in the vapor, temperature at which diffusion takes place, time of exposure and surface condition of the body. A further comment on the environment during the diffusion is that at the elevated temperatures necessary for diffusion, stable oxides may be formed quite readily with either the impurity or the semiconductor body and the presence of these oxides may influence the rate of penetration. For this reason it is recommended that the diffusion operation be carried out in a reducing atmosphere.

In the above discussion only the points in the technology that have a particular bearing on vapor diffusion have been stressed. It should be noted, however, that the degree of purity in semiconductor fabrication is greater than can be detected by spectroscopic means; for example one impurity atom in ten million crystal atoms is sufficient to alter conductivity, and, for this reason it is standard practice in the art to practice extreme care in all stages of a semiconductor fabrication process to preserve this degree of purity.

As a specific example illustrating the above teaching the vapor diffusion operation to produce the NPN transistor of Figure 2 by the novel method of this invention is performed as follows. A P type germanium crystal wafer having reasonably few surface imperfections and having controlled area indium coatings on opposite surfaces is maintained in a reducing atmosphere at a temperature of 800° C. for 19 hours. During this time the crystal is exposed to an arsenic vapor having a concentration of arsenic atoms between $1\times10^{18}$ and $1\times10^{16}$ atoms per cc. It is pointed out here that in line with the above teaching the upper limit of arsenic concentration is governed by the desire not to approach too closely to the equilibrium vapor pressure of arsenic and that the lower limit is governed by the depth of penetration desired in a given time. Under these conditions the depth of penetration of the arsenic into the exposed surface of the germanium crystal is .002 inch and the depth of penetration of the arsenic into the crystal under the indium layers is .006 inch.

The above example is included only to aid in understanding and to facilitate the practicing of the invention it being understood that the invention is not to be limited to the specifications recited since as pointed out above a wide range of such sets of specifications will be encountered in practicing the invention to fabricate the many possible semiconductor devices.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A process of forming a junction in an elemental semiconductor body of a given conductivity type when measured at a sufficiently low temperature comprising in combination the steps of coating a surface of the elemental semiconductor body with a layer of material capable of retaining an impurity element in contact with the surface of said body, said impurity element being a member of a group of conductivity determining materials of a type opposite to said given conductivity type of said body type, exposing said coated body to a vapor containing said impurity element in the presence of heat in a concentration proper for vapor diffusion, and removing material from the surface of said body to a depth that is greater than the depth of penetration of said impurity element into said body on areas not covered by said layer but not as great as the depth of penetration of said element under said layer.

2. A process of forming a junction in an elemental semiconductor body of a given conductivity type when measured at a sufficiently low temperature comprising in combination the steps of coating a surface of said body with an element from group III of the periodic table, exposing said coated body in the presence of heat to a vapor containing an element from group V of the periodic table in a concentration proper for vapor diffusion, and removing material from the surfaces of said body to a depth that is greater than the depth of penetration of said group V element into said body in areas not covered by said layer but not as great as the depth of penetration of said group V element under said layer.

3. A process of forming a junction in an elemental semiconductor body of a given conductivity type when measured at a sufficiently low temperature comprising in combination the steps of coating a surface of an elemental semiconductor body with an element from group V of the periodic table, heating said coated body in the presence of vapor containing an element from group III of the periodic table in a concentration proper for vapor diffusion, and subsequently removing material from the surfaces of said body to a depth that is greater than the depth of penetration of said group III element into said body in areas not covered by said layer but not as great as the depth of penetration of said group III element under said layer.

4. A process for forming a junction in a germanium semiconductor device comprising coating a surface of a semiconductor body of a first conductivity type with a conductivity type directing impurity material of said first conductivity type, exposing said semiconductor body to the vapor of an impurity material of a type opposite to said first conductivity type at an elevated temperature in a concentration proper for vapor diffusion, and removing the exposed surfaces of said semiconductor body to a uniform depth greater than the depth of penetration of said opposite conductivity type directing impurity material from said vapor into surfaces that are not coated but not as great as the depth of penetration under said coated area.

5. A method of producing a junction in a germanium semiconductor body comprising in combination the steps of coating a surface of said semiconductor body with a material capable of retaining a conductivity type directing impurity element in contact with the surface of said body, heating said coated semiconductor body in the presence of a vapor containing said conductivity type directing impurity element in a concentration proper for vapor diffusion, and providing a differentiation of conductivity type regions in said semiconductor body by removal of portions of the surface thereof to a uniform depth.

6. A method of producting a semiconductor device comprising in combination the steps of coating a surface of a P type elemental semiconductor body with an element from group III of the periodic table, exposing said coated body in the presence of heat to a vapor containing an element from group V of the periodic table in a concentration proper for vapor diffusion, and providing a differentiation in conductivity type regions in said body by removing portions of the surface thereof to a uniform depth.

7. A method of producing a semiconductor device comprising in combination the steps of coating a surface of an N type elemental semiconductor body with an element from group V of the periodic table, exposing said coated body in the presence of heat to a vapor containing an element from group III of the periodic table in a concentration proper for vapor diffusion, and providing a differentiation in conductivity type regions in said body by removing portions of the surface thereof to a uniform depth.

8. A method of producing a PN junction in a germanium semiconductor crystal comprising applying a layer of indium to the surface of a P type conductivity germanium semiconductor crystal, vapor diffusing arsenic into said crystal, and removing a portion of said crystal at said surface to a depth greater than the depth of penetration of said arsenic on areas of said surface not covered by said layer but not as great as the depth of penetration of said arsenic under said layer.

9. A method of producing a PN junction in a germanium semiconductor crystal comprising applying a layer of gallium to the surface of a P type conductivity germanium semiconductor crystal, vapor diffusing arsenic into said crystal, and removing a portion of said crystal at said surface to a depth greater than the depth of penetration of said arsenic on areas of said surface not covered by said layer but not as great as the depth of penetration of said arsenic under said layer.

References Cited in the file of this patent

UNITED STATES PATENTS

| | | |
|---|---|---|
| 2,597,028 | Pfann | May 20, 1952 |
| 2,656,496 | Sparks | Oct. 20, 1953 |
| 2,701,326 | Pfann et al. | Feb. 1, 1955 |
| 2,750,542 | Armstrong et al. | June 12, 1956 |
| 2,789,068 | Maserjian | Apr. 16, 1957 |

FOREIGN PATENTS

| | | |
|---|---|---|
| 730,123 | Great Britain | May 18, 1955 |

OTHER REFERENCES

Armstrong: Proc. I.R.E., No. 11, vol. 40, pp. 1341, 1342, November 1952.

UNITED STATES PATENT OFFICE

CERTIFICATE OF CORRECTION

Patent No. 2,898,247 August 4, 1959

Lloyd P. Hunter

It is hereby certified that error appears in the printed specification of the above numbered patent requiring correction and that the said Letters Patent should read as corrected below.

Column 5, line 1, strike out "type".

Signed and sealed this 28th day of June 1960.

(SEAL)
Attest:

KARL H. AXLINE
Attesting Officer

ROBERT C. WATSON
Commissioner of Patents